United States Patent
Chiu et al.

(10) Patent No.: US 9,543,222 B2
(45) Date of Patent: Jan. 10, 2017

(54) METHODS FOR MEASURING THE FULL WELL CAPACITY OF CMOS IMAGE SENSORS

(71) Applicant: Taiwan Semiconductor Manufacturing Company, Ltd., Hsin-Chu (TW)

(72) Inventors: Kai-Ling Chiu, Taipei (TW); Tse-Hua Lu, Zhubei (TW); Yu-Kuo Cheng, Zhudong Township (TW); Po-Chun Chiu, Hsin-Chu (TW); Ping-Fang Hung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/725,213

(22) Filed: May 29, 2015

(65) Prior Publication Data
US 2015/0262891 A1 Sep. 17, 2015

Related U.S. Application Data

(62) Division of application No. 13/892,092, filed on May 10, 2013, now Pat. No. 9,048,126.

(60) Provisional application No. 61/778,346, filed on Mar. 12, 2013.

(51) Int. Cl.
| | |
|---|---|
| H01L 21/66 | (2006.01) |
| H01L 27/146 | (2006.01) |
| H01L 23/525 | (2006.01) |
| H01L 49/02 | (2006.01) |

(52) U.S. Cl.
CPC ............ *H01L 22/14* (2013.01); *H01L 22/10* (2013.01); *H01L 22/34* (2013.01); *H01L 23/5256* (2013.01); *H01L 27/14609* (2013.01); *H01L 27/14612* (2013.01); *H01L 27/14621* (2013.01); *H01L 27/14627* (2013.01); *H01L 27/14636* (2013.01); *H01L 27/14685* (2013.01); *H01L 27/14689* (2013.01); *H01L 28/40* (2013.01); *H01L 2924/0002* (2013.01)

(58) Field of Classification Search
CPC .......... H01L 22/12; H01L 22/20; H01L 22/34; H01L 22/14; H01L 22/16
USPC .......................................... 438/14, 16, 17, 18
See application file for complete search history.

(56) References Cited

U.S. PATENT DOCUMENTS

| | | | | |
|---|---|---|---|---|
| 6,797,933 B1 * | 9/2004 | Mendis | .............. | H04N 1/00002 250/208.1 |
| 7,821,100 B2 * | 10/2010 | Higuchi | .............. | H01L 23/5256 257/209 |

OTHER PUBLICATIONS

Gardner, David "Characterizing Digital Cameras with the Photon Transfer Curve," http://www.couriertronics.com/docs/notes/cameras_application_notes/Photon_Transfer_Curve_Characterization_Method.pdf, Undated document, Retrieved from Internet. Couriertronics.com, Summit Imaging, 6 pages. [online] 2008.

(Continued)

*Primary Examiner* — Quoc Hoang
(74) *Attorney, Agent, or Firm* — Slater Matsil, LLP

(57) ABSTRACT

An integrated circuit device includes a transfer-gate transistor, and a photo diode connected to a source/drain region of the transfer-gate transistor. An electrical fuse is electrically coupled to a gate of the transfer-gate transistor. A diode is electrically coupled to the electrical fuse.

20 Claims, 8 Drawing Sheets

(56) References Cited

OTHER PUBLICATIONS

Janesick, James R., "Photon Transfer DN-v," Library of Congress Cataloging-in-Publication Data, vol. PM 170, published by SPIE, Aug. 2007, 3 pages.

\* cited by examiner

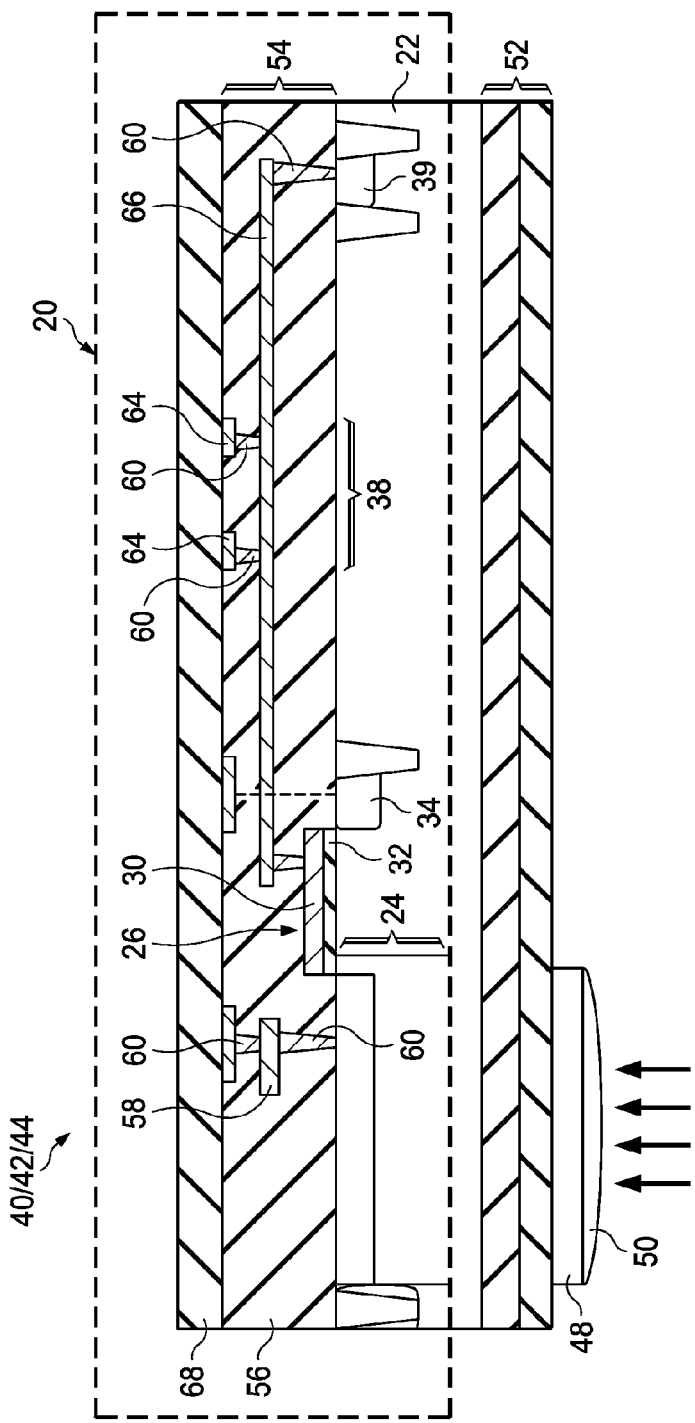

METHODS FOR MEASURING THE FULL WELL CAPACITY OF CMOS IMAGE SENSORS

PRIORITY CLAIM AND CROSS-REFERENCE

This application is a divisional of U.S. patent application Ser. No. 13/892,092 entitled "Methods for Measuring the Full Well Capacity of CMOS Image Sensors," filed May 10, 2013, which application claims the benefit of the following provisionally filed U.S. patent application: Application Ser. No. 61/778,346, filed Mar. 12, 2013, and entitled "Methods for Measuring the Full Well Capacity of CMOS Image Sensors," which application is hereby incorporated herein by reference.

BACKGROUND

Full well capacity is one of the major characteristics of Complementary Metal-Oxide-Semiconductor (CMOS) image sensors. The full well capacity is a measurement of how much charges an image sensor may store before the charges overflow. The full well capacity determines the dynamic range of the image sensors. A high full well capacity means that the respective image sensor may have a great difference between the brightest level and darkest level of sensed signals. Hence, the full well capacity needs to be known to determine the quality of the image sensor chip. If necessary, the manufacturing process of the image sensor chips may be adjusted when the respective full well capacity does not meet design requirement.

BRIEF DESCRIPTION OF THE DRAWINGS

For a more complete understanding of the embodiments, and the advantages thereof, reference is now made to the following descriptions taken in conjunction with the accompanying drawings, in which:

FIG. 7B illustrates a cross-sectional view of a test structure for determining a full well capacity of image sensors in accordance with some exemplary embodiments, wherein an electrical fuse is formed of a metal line, and wherein a backside process has been performed on the test structure;

FIG. 8 illustrates a portion of a pixel unit of an image sensor chip, wherein no diode and electrical fuse are connected to the gate of the transfer-gate transistor in the pixel unit;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A full well capacity test structure and the method of determining the full well capacity of Complementary Metal-Oxide-Semiconductor (CMOS) image sensors are provided in accordance with various exemplary embodiments. The variations and the operation process of the embodiments are discussed. Throughout the various views and illustrative embodiments, like reference numbers are used to designate like elements.

Figure 1:
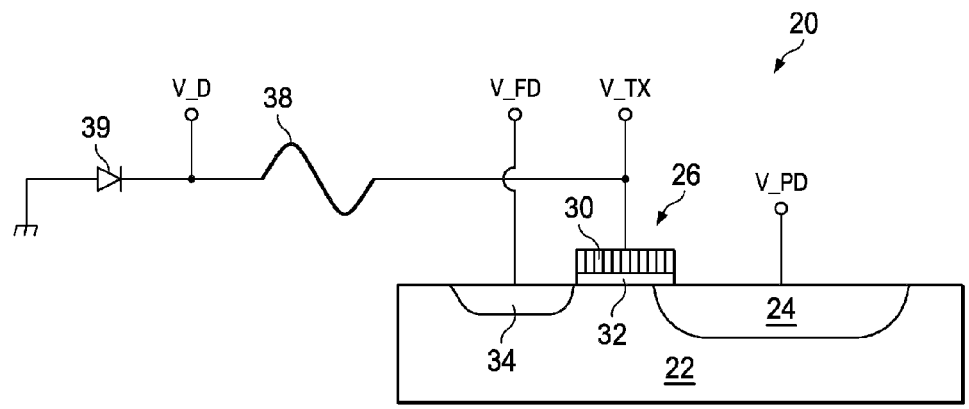
FIG. 1 illustrates a circuit diagram of a test structure for determining a full well capacity of image sensors in accordance with some exemplary embodiments.

FIG. 1 illustrates a circuit diagram of test structure 20, which is formed at a surface of semiconductor substrate 22. Test structure 20 includes photo diode 24 and transfer-gate transistor 26. Transfer-gate transistor 26 includes gate 30 and gate dielectric 32 over semiconductor substrate 22. Photo diode 24 is formed in semiconductor substrate 22 in accordance with some embodiments. A first source/drain region of transfer-gate transistor 26 may be shared by photo diode 24, and hence the cathode of photo diode 24 is connected to the first source/drain region of transfer-gate transistor 26. Floating diffusion capacitor 34 is formed in substrate 22, for example, by implanting substrate 22 to form a p-n junction, which acts as floating diffusion capacitor 34. Floating diffusion capacitor 34 may be formed in a second source/drain region of transfer-gate transistor 26. In accordance with some embodiments, floating diffusion capacitor 34 includes a first capacitor plate connected to the second source/drain region of transfer-gate transistor 26, and a second capacitor plate connected to substrate 22. The second capacitor plate of floating diffusion capacitor 34 may be electrically grounded. Hence, when transfer-gate transistor 26 is turned on, the charges in photo diode 24 are transferred through transfer-gate transistor 26, and stored in floating diffusion capacitor 34.

In some embodiment, transfer-gate transistor 26 is an N-type Metal-Oxide-Semiconductor (NMOS) transistor. Gate 30 of transfer-gate transistor 26 is further coupled to an end of Electrical Fuse (E-fuse) 38. The other end of E-fuse 38 is connected to the cathode of diode 39, whose anode is further connected to the electrical ground.

Figure 2A:
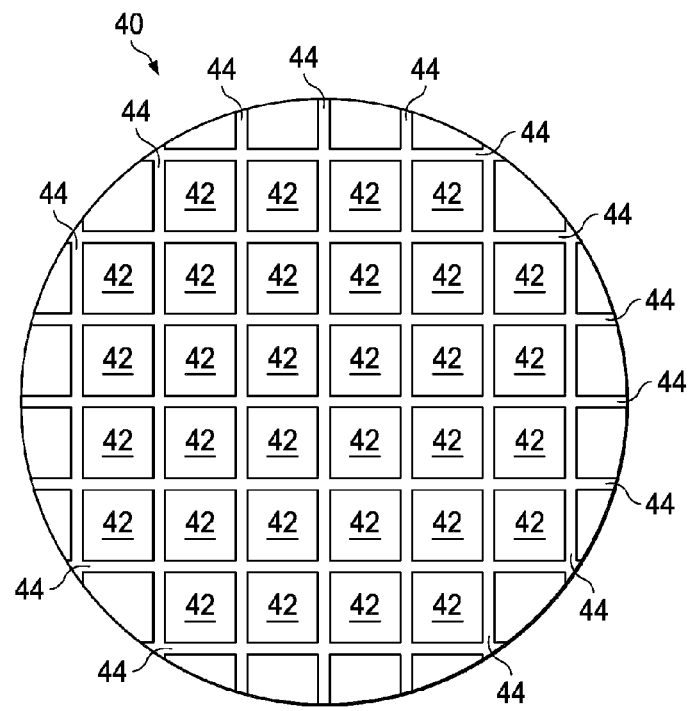
FIG. 2A illustrates a top view of a wafer, in which test structures are formed.
Figure 2B:
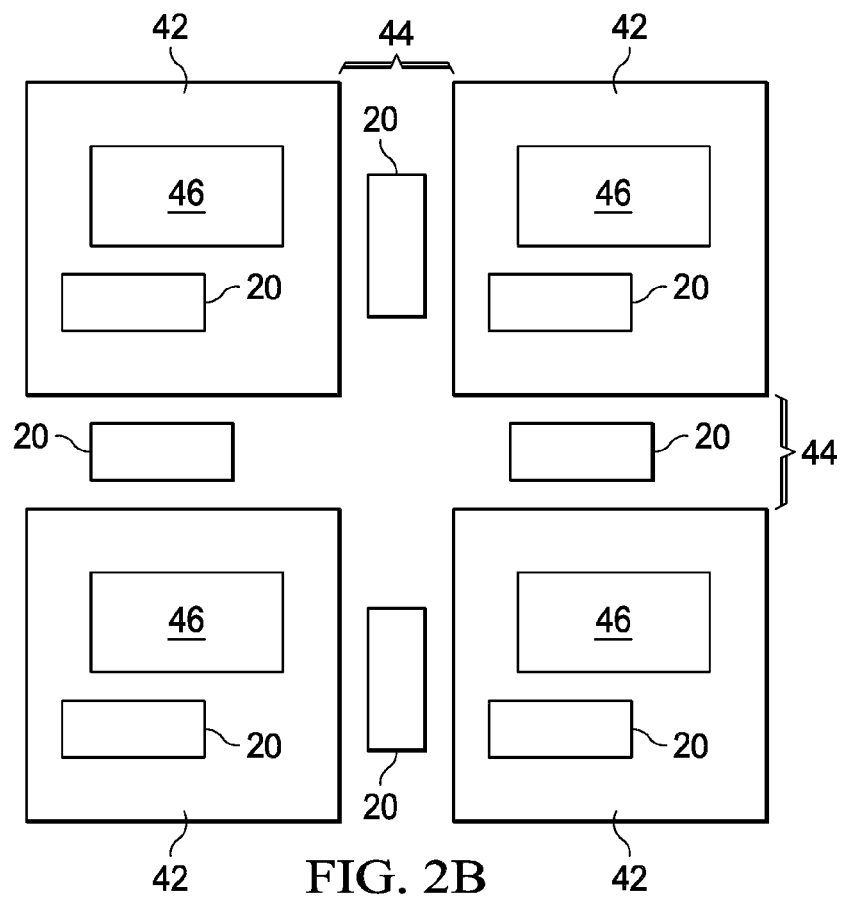
FIGS. 2B and 2C illustrate a magnified view and a cross-sectional view, respectively, of a portion of the wafer.
Figure 2C:
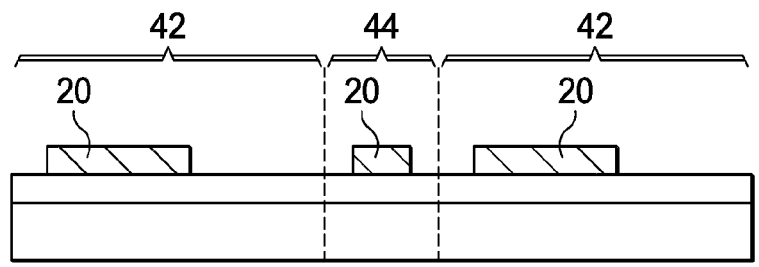

FIG. 2A illustrates a top view of wafer 40, which includes image sensor chips 42 and scribe lines 44 separating image sensor chips 42 from each other. A portion of wafer 40 is illustrated in FIG. 2B, which is a magnified view of a portion of FIG. 2A. In some embodiments, test structures 20 are formed in image sensor chips 42. In alternative embodiments, test structures 20 are formed in scribe lines 44. In yet alternative embodiments, test structures 20 are formed in both image sensor chips 42 and scribe lines 44. Each of test structures 20 in FIG. 2B may be identical to the test structure 20 in FIG. 1. In addition to test structures 20, image sensor chips 42 also include image sensor arrays 46, with each including a plurality of image sensors arranged as rows and columns, wherein each of the image sensors may include the structure shown in FIG. 8. For example, each of the image sensors may include photo diode 124 (FIG. 8), which has a structure identical to the structure of photo diode 24 in FIG. 1. FIG. 2C illustrates a schematic cross-sectional view of wafer 40. The cross-sectional view shows that test structure 20 may be formed in image sensor chips 42 and/or scribe lines 44.

In accordance with some embodiments, image sensor chips 42 (FIGS. 2A and 2B) are Backside Illumination (BSI) image sensor chips, and wafer 40 (FIG. 2A) is a BSI image sensor wafer. Test structure 20 may be formed in front side process (step 202 in FIG. 9, including Front End of Line (FEOL) process and Back End of Line (BEOL)). Test structure 20 may be formed during and/or before the BEOL processes of BSI image sensor wafer 40, wherein the BEOL processes include the formation of metal layers and dielectric layers on the front side of wafer 40, and the FOL process is the process for forming, for example, transistors (such as 26) and image sensors 24. A formation process and test process of test structure 20 in BSI image sensor chips 42 are described referring to FIGS. 3A through 7B in accordance with some exemplar embodiments, and a respective process flow is briefly described referring to FIG. 9.

Figure 3A:
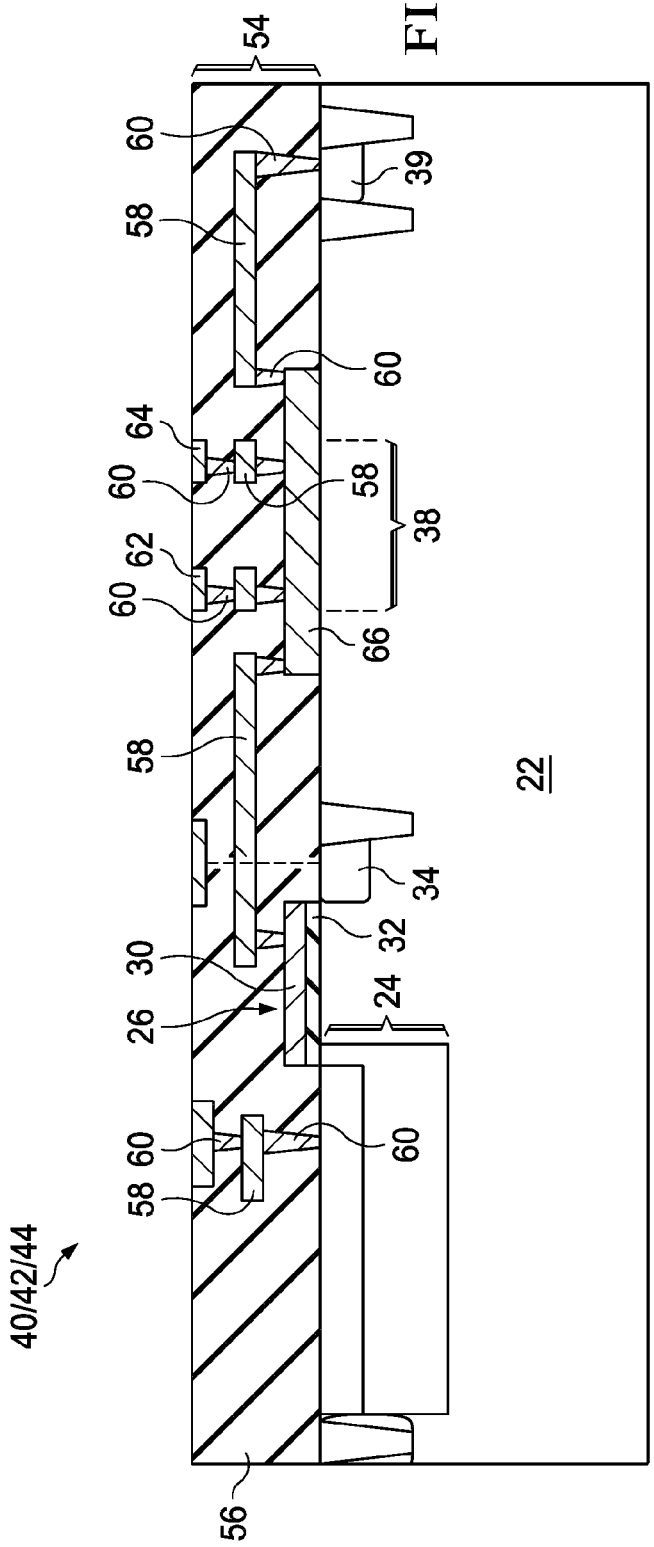
FIG. 3A illustrates a cross-sectional view of a test structure for determining a full well capacity of image sensors in accordance with some exemplary embodiments, wherein an electrical fuse is formed of polysilicon, and wherein a front-side process has been performed on the test structure.
Figure 3B:
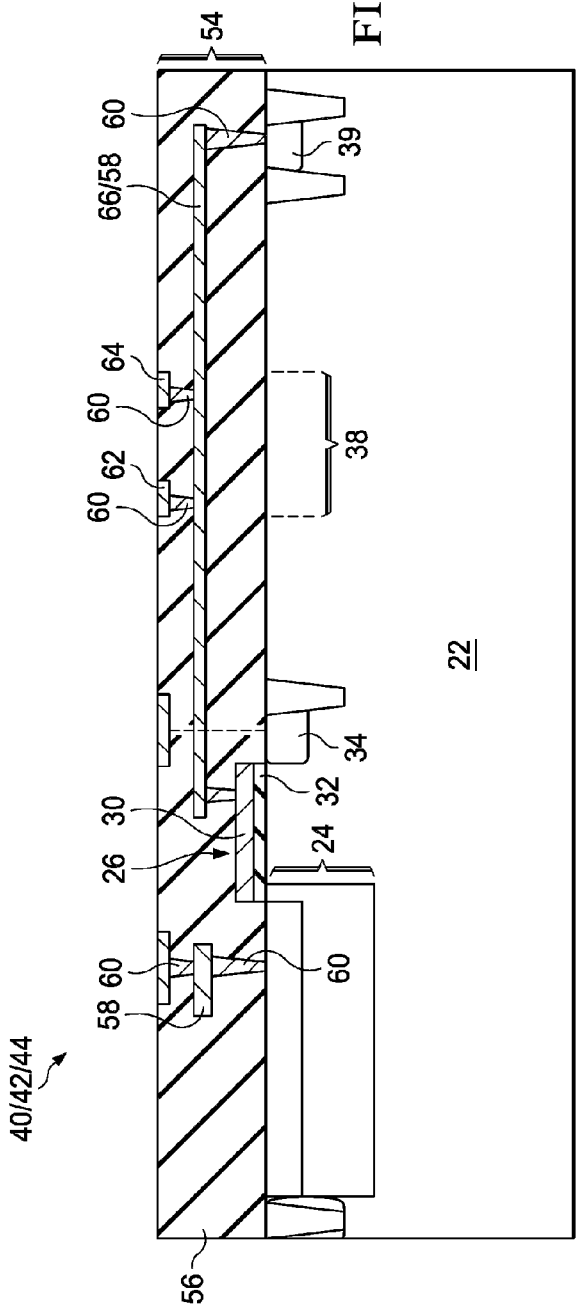
FIG. 3B illustrates a cross-sectional view of a test structure for determining a full well capacity of image sensors in accordance with some exemplary embodiments, wherein an electrical fuse is formed of a metal line, and wherein a front-side process has been performed on the test structure.
Figure 9:
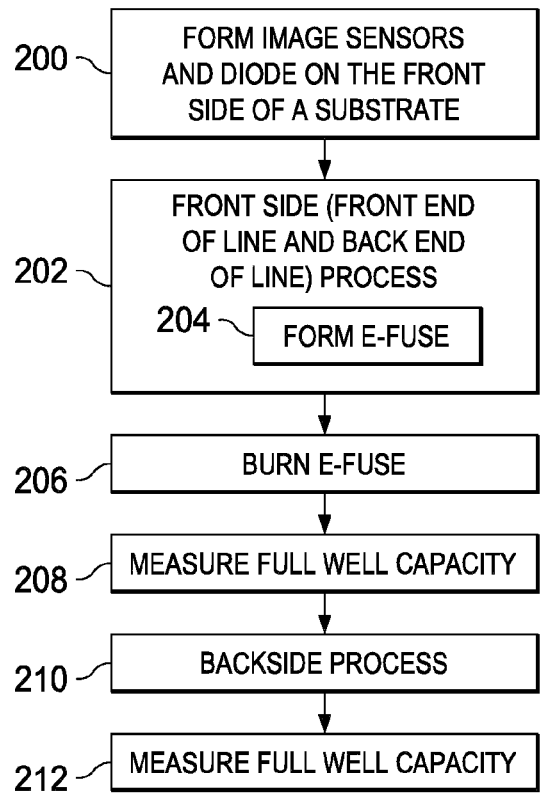
FIG. 9 illustrates a process flow for manufacturing and testing the wafer.

Referring to FIG. 3A, which is a cross-sectional view, photo diode 24, floating diffusion capacitor 34, and diode 39 are formed in substrate 22 (step 200 in FIG. 9). Transfer-gate transistor 26 is also formed at the surface of substrate 22. Next, the BEOL process (step 202 in FIG. 9) is performed to form interconnect structure 54, which includes dielectric layers 56 and metal lines 58 and vias 60 in dielectric layers 56. In some embodiments, dielectric layers 56 are low-k dielectric layers, for example, with dielectric constants (k values) lower than about 3.0. Gate 30 of transfer-gate transistor 26 is electrically connected to one end of conductive line 66, which may be formed of polysilicon in accordance with some embodiments. A portion of polysilicon line 66 functions as E-fuse 38. Polysilicon line 66 and the respective E-fuse 38 may be formed (step 204 in FIG. 9) simultaneously with the formation of gate 30 in accordance with some exemplary embodiments. The other end of conductive line 66 is connected to diode 39. Metal pads 62 and 64 are connected to two points of conductive line 66, wherein the portion of conductive line 66 between the connecting points forms E-fuse 38. FIG. 3B illustrates a structure similar to the structure in FIG. 3A, except that conductive line 66 is formed of a metal line, which is in dielectric layers 56.

In the manufacturing of the structure in FIGS. 3A and 3B, a plurality of processes may involve the generation of plasma, which results in the charge accumulation in the metal lines and vias (not shown) that are connected to gate 30 of transfer-gate transistor 26. The process involving plasma may include, for example, deposition processes, plasma treatments, cleaning processes, etching processes, and the like. Since test structure 20 is often connected to a significant number of metal lines and vias, such as metal lines 58 and vias 60, the metal lines and vias act as an antenna. During the BEOL processes, the antenna collects electrons (for example, generated from the plasma), and hence the charges (electrons in some embodiments) accumulate in gate 30 and the respective connecting metal lines and vias, resulting in a high voltage on gate 30. A high voltage difference is hence applied on the opposite side of gate dielectric 32, and my result in the breakdown of gate dielectric 32. Diode 39 thus protects gate dielectric 32 from being damaged. When the voltage on gate 30 is too low, for example, with the difference of the voltages on gate 30 and substrate 22 being higher than the activation voltage (for example, between about 0.3 V and about 0.7 V) of diode 39, diode 39 is turned on, and the excess charges are conducted to substrate 22. The voltage difference between gate 30 and substrate 22 is brought down, and gate dielectric 32 is protected.

Figure 4:
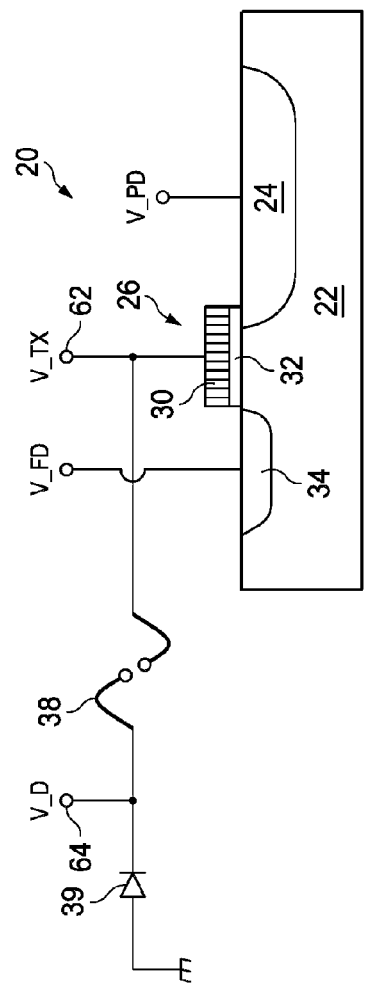
FIG. 4 illustrates a circuit diagram of a test structure for determining a full well capacity of image sensors, wherein an electrical fuse in the test structure has been burned.

Referring to FIG. 4, after the FEOL and BEOL processes are finished, E-fuse 38 is burned (step 206 in FIG. 9), and hence diode 39 is disconnected from gate 30 of transfer-gate transistor 26. The burning of E-fuse 38 may be achieved by applying voltages V_D and V_Tx (FIG. 4) to the opposite ends of E-fuse 38, and hence the current flowing through E-fuse 38 causes E-fuse 38 to be burned. In some embodiments, as shown in FIGS. 3A and 3B, voltages V_D and V_Tx are applied through metal pads 64 and 62 (FIGS. 3A and 3B), respectively, wherein metal pads 64 and 62 are exposed on the front surface of wafer 40.

Referring again to FIG. 4, after E-fuse 38 is burned, a measurement (step 208 in FIG. 9) is performed on test structure 20 to determine the full well capacity of test structure 20. In some embodiments, during the measurement, gate 30 is applied with a negative voltage V_Tx to force transfer-gate transistor 26 to go into accumulation mode, and transfer-gate transistor 26 is turned off. The negative voltage V_Tx may be between about (−0.1) V and about −1.5 V in accordance with some exemplary embodiments. It is appreciated, however, that the values recited throughout the description are merely examples, and may be changed to different values. Floating diffusion capacitor 34 may be applied with voltage V_FD, which may be a positive voltage, and may be between about (0.5) V and about (4.0) V, for example. Photo diode 24 is then swept with the voltage V_PD sweeping in the range, for example, between about −0.5 V and about (3.0) V. The I-V curve of test structure 20 is measured during the voltage sweeping, and FIG. 5 illustrates an exemplary I-V curve.

Figure 10:
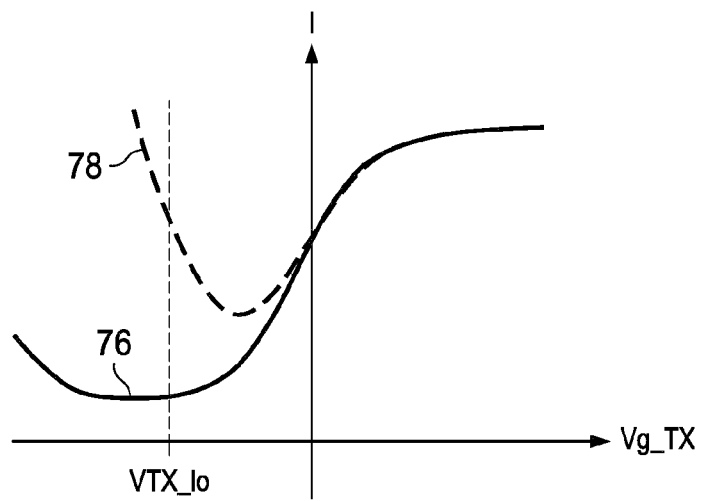
FIG. 10 illustrates the measured I-V curves when the E-fuse connected to the test structure is burned or not burned.

During the measurement, negative voltage V_Tx (for example, about (−0.1)V~(−1.5 V) is lower than the voltage of substrate 22 by a difference greater than the activation voltage of diode 39. Therefore, if diode 39 is not disconnected from gate 30, the gate voltage V_Tx cannot be set to the range desirable by the measurement. This results in the I-V curve of the resulting pixel (refer to FIG. 8) to be different from the real I-V curve. For example, FIG. 10 schematically illustrates the function of E-fuse 38 (FIG. 1). In FIG. 10, the X axis represents the voltage Vg_Tx (FIG. 1) applied on gate 30 of transfer-gate transistor 26, and the Y axis represents the current I flowing between photo diode 24 (FIG. 1) and floating diffusion capacitor 34 (FIG. 1). The actual I-V curve, which represents the correct behavior of the respective pixel 24/124 (FIGS. 1 and 8) is shown as line 76. If E-fuse 38 is not burned, then the measured I-V curve becomes line 78 due to the adverse effect of E-fuse 38. When the respective pixel is operated, the bias voltage is at VTX_Lo. As shown in FIG. 10, at bias voltage VTX_Lo, the difference between the currents reflected by lines 76 and 78 is significant. By burning E-fuse 38, the measured I-V curve will be the correct I-V curve as shown by line 76. Hence, E-fuse 38 functions as a conductive path for discharging the excess charges in gate 30 during the FEOL processes, and is burned when such conductive path hampers the measurement of the full well capacity.

Figure 5:
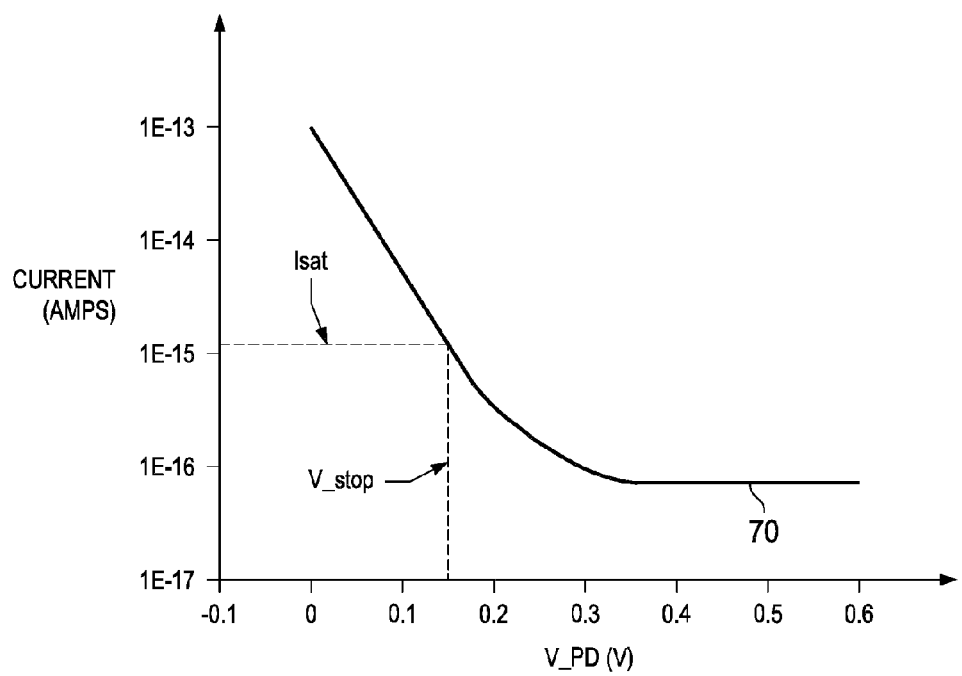
FIG. 5 illustrates an I-V curve of the test structure.

FIG. 5 illustrates an exemplary I-V curve obtained by measuring test structure 20 (FIG. 4). The Y-axis represents the leakage current between photo diode 24 (FIG. 4) and floating diffusion capacitor 34, which leakage current represents the current of the overflowed charges from photo diode 24. The leakage current is illustrated as a function of voltage V_PD, which is the voltage applied on photo diode 24. FIG. 5 illustrates that with the reduction of voltage V_PD, the leakage current increases. It is appreciated that when photo diode 24 (FIG. 4) is exposed to light, the charges in photo diode 24 accumulate, and causes the voltage V_PD to drop. Hence, the sweeping of voltage V_PD from high voltages to low voltages simulates the exposure of photo diode 24 to light.

When photo diode 24 is exposed to light, and with the accumulation of charges in photo diode 24, at some point, the full well capacity of test structure 20 is reached. Photo diode 24 is hence saturated, and cannot accumulate more charges. All additional charges received by photo diode 24 will hence be leaked out, for example, into floating diffusion capacitor 34, resulting in a saturation leakage current Isat, as shown in FIG. 5. In accordance with some embodiments, the saturation leakage current Isat is determined from the simulation of test structure 20. In alternative embodiments, the saturation leakage current Isat is measured from the BSI chips that have already been manufactured. For example, saturation leakage current Isat may be measured by exposing a manufactured photo diode to a strong light, and measuring the respective leakage currents leaked to the respective floating diffusion capacitor. Alternatively, saturation leakage current Isat may be calculated by multiplying a sensitivity by a irradiance, wherein the sensitivity (with the unit being charge/(lumens*time)) represents how much charges are generated when photo diode 24 is exposed to a light having certain intensity (lumens) for a certain period of time, and the irradiance represents the light amount (in lumens, for example). The sensitivity can also be obtained through simulation.

As shown in FIG. 5, saturation leakage current Isat corresponds to a quasi-Fermi level, which is dented as voltage V_stop. Voltage V_stop represents the value of V_PD (FIG. 4) when the full well capacity of test structure 20 is reached, and no more charges can be stored in photo diode 24.

Figure 6:
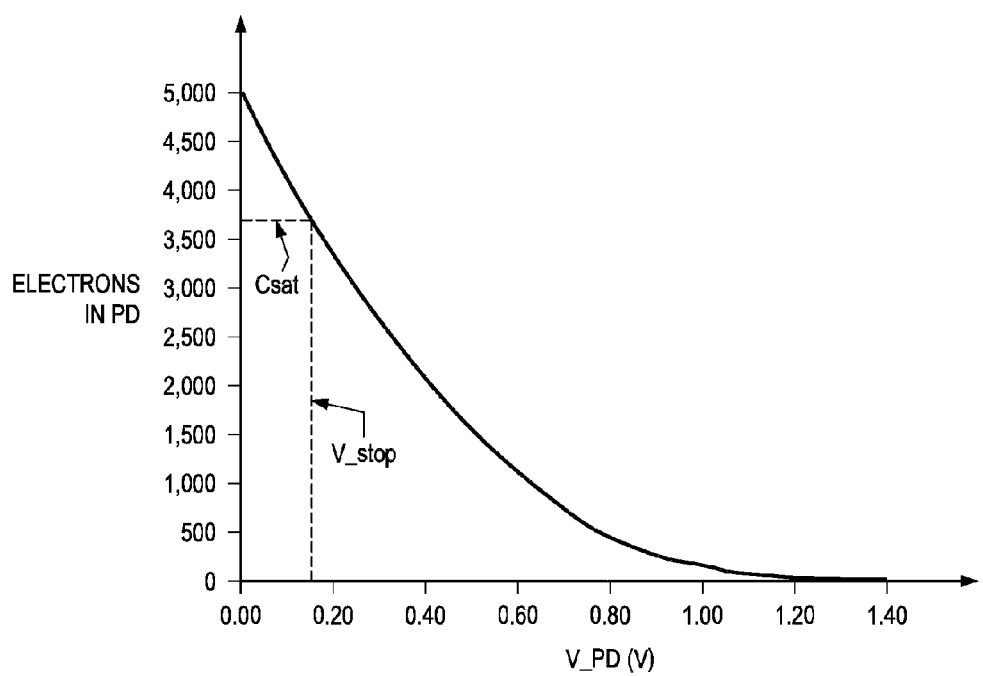
FIG. 6 illustrates the number of electrons as a function of a sweeping voltage applied on a photo diode in the test structure, wherein the electrons are stored in the photo diode.

When charges accumulate in photo diode 24, the value of V_PD (FIG. 4) reduces accordingly. The respective behavior is illustrated as line 70 in FIG. 6. FIG. 6 illustrates the charge amount (for example, measured using the number of electrons) in photo diode 24 (FIG. 4) as a function of voltage V_PD (FIG. 4). In FIG. 6, the Y-axis represents the number of electrons. Line 70 in FIG. 6 may be obtained through the simulation of image sensors, or may be obtained by measuring the image sensors that have already been manufactured. As shown in FIG. 6, voltage V_stop corresponds to charge number Csat, which represents the full well capacity of test structure 20. Hence, through the steps shown in FIGS. 4, 5, and 6, the full well capacity of test structure 20 may be determined.

Figure 7A:
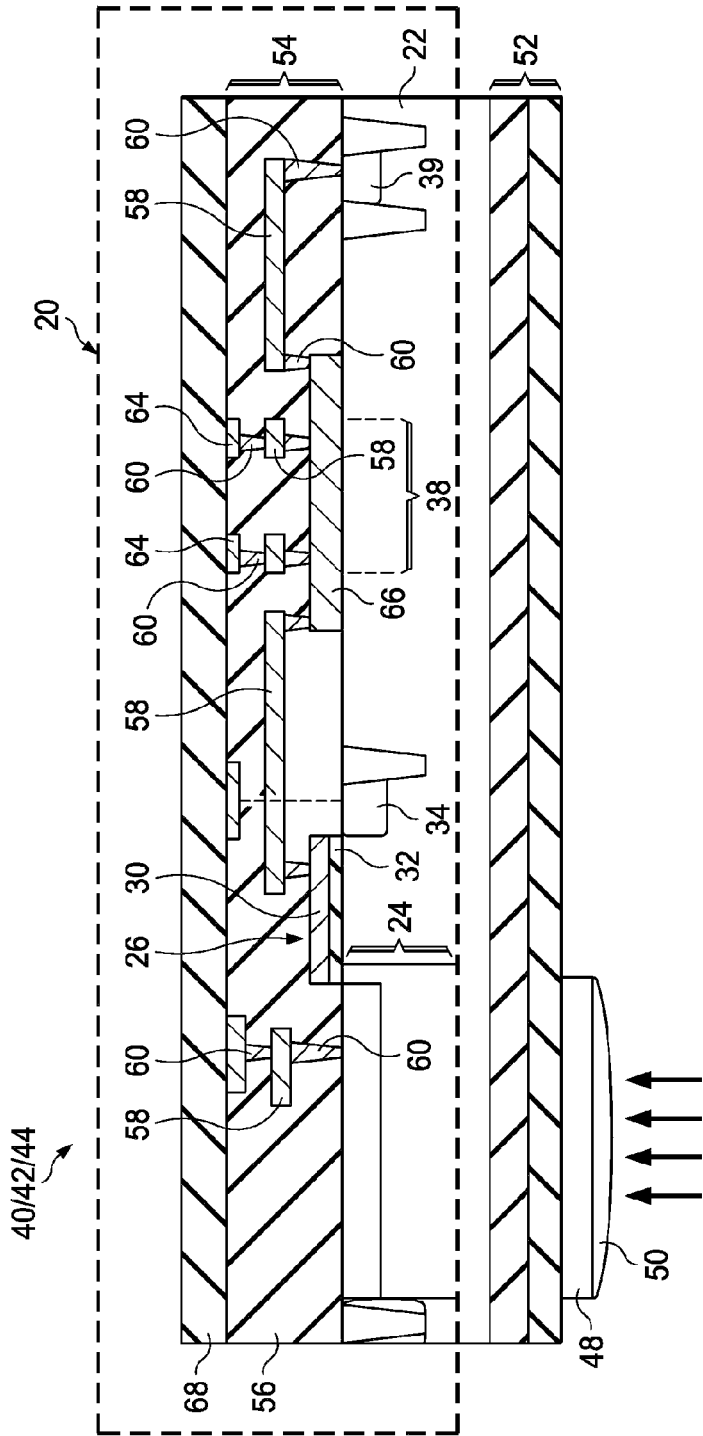
FIG. 7A illustrates a cross-sectional view of a test structure for determining a full well capacity of image sensors in accordance with some exemplary embodiments, wherein an electrical fuse is formed of polysilicon, and wherein a backside process has been performed on the test structure.

In accordance with some embodiments, after the measurement step, as shown in FIGS. 7A and 7B, passivation layer 68 is formed on the front side of BSI image sensor chip 42. Passivation layer 68 may comprise silicon oxide, silicon nitride, un-doped silicate glass, or multi-layers thereof. In accordance with some embodiments, passivation layer 68 covers metal pads 62 and 64, and no metal pads are exposed through the front side of BSI image sensor chip 42. Next, the manufacturing of wafer 40 (FIG. 4) is continued, and the backside process (step 210 in FIG. 9) is performed.

Referring again to FIGS. 7A and 7B, in the backside process, semiconductor substrate 22 is first thinned, for example, to a thickness ranging from several microns to tens of microns. Dielectric layers such as oxide layers 52, color filters 48, and micro-lenses 50 are formed on the backside of substrate 22. A metal grid (not shown) may also be formed on the backside of substrate 22. The formation processes are not discussed in detail herein. In accordance with some embodiments, after the formation of color filters 48 and micro-lenses 50, the full well capacity may also be determined (step 212, FIG. 9) using essentially the same method as described in FIGS. 4, 5, and 6. In the respective embodiments, additional metal pads (not shown) may be formed to electrically couple to photo diode 24, floating diffusion capacitor 34, and gate 30 of transfer-gate transistor 26 (FIG. 1), which additional metal pads may be exposed through either the front surface or the back surface of wafer 40.

In accordance with some embodiments of the present disclosure, the full well capacity determination is performed in step 208 in FIG. 9. In alternative embodiments, the full well capacity determination is performed in step 212 in FIG. 9. In yet alternative embodiments, the full well capacity determination is performed in both steps 208 and 212 in FIG. 9. Hence, more flexibility is provided for measuring full well capacity in accordance with the embodiments of the present disclosure.

FIG. 8 illustrates a diagram of a portion of pixel unit 74 in array 46 (FIG. 2B), wherein array 46 includes a plurality of pixel units 74 arranged as a plurality of rows and columns. In accordance with the embodiments of the present disclosure, the illustrated pixel unit 74 includes photo diode 124, which is identical to photo diode 24 in FIG. 1. Furthermore, photo diode 124 and 24 may be formed simultaneously using same process steps. Therefore, the full well capacity of photo diode 24 in FIG. 1 is the same as the full well capacity of the respective image sensor, and by measuring the full well capacity of test structure 20 in FIG. 1, the full well capacity of diode 124 is known. In some embodiments, gate 130 of transfer-gate transistor 126 may not be connected to any protection diode that is designed to protect transfer-gate transistor 126.

In the embodiments of the present disclosure, the formation of the E-fuse solves the dilemma that the diode in the test structure protects the gate dielectric of the transfer-gate transistor, but prevents a required negative gate voltage to be applied on the gate of the transfer-gate transistor. In addition, the determination method of the full well capacity in accordance with the embodiments may be performed before the backside process of the BSI image sensor chips is performed. This enables the finding of any process problem in the early stage of the manufacturing process.

In accordance with some embodiments, an integrated circuit device includes a transfer-gate transistor, and a photo diode connected to a source/drain region of the transfer-gate transistor. An electrical fuse is electrically coupled to a gate of the transfer-gate transistor. A diode is electrically coupled to the electrical fuse.

In accordance with other embodiments, an integrated circuit structure includes a semiconductor substrate and a test structure. The test structure includes a transfer-gate transistor at a front surface of the semiconductor substrate, and a photo diode in the semiconductor substrate. The photo diode is connected to a first source/drain region of the transfer-gate transistor. A floating diffusion capacitor is connected to a second source/drain region of the transfer-gate transistor. An electrical fuse is electrically coupled to a gate of the transfer-gate transistor. A diode is electrically coupled to the electrical fuse. Two metal pads are disposed on a front side of the semiconductor substrate, wherein the two metal pads are electrically connected to opposite ends of the electrical fuse.

In accordance with yet other embodiments, a method includes forming a test structure. The test structure includes a transfer-gate transistor at a front surface of the semiconductor substrate, and a photo diode in the semiconductor substrate. The photo diode is connected to a first source/drain region of the transfer-gate transistor. A floating diffusion capacitor is connected to a second source/drain region of the transfer-gate transistor. An electrical fuse is electrically coupled to a gate of the transfer-gate transistor. A diode is electrically coupled to the electrical fuse. The method further includes burning the electrical fuse, and, after the electrical fuse is burned, measuring a full well capacity of the photo diode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a test structure comprising:
        a transfer-gate transistor at a front surface of a semiconductor substrate;
        a photo diode in the semiconductor substrate, wherein the photo diode is connected to a first source/drain region of the transfer-gate transistor;
        a floating diffusion capacitor, wherein the floating diffusion capacitor is connected to a second source/drain region of the transfer-gate transistor; and
        an electrical fuse electrically coupled to a gate of the transfer-gate transistor burning the electrical fuse; and
    after the electrical fuse is burned, measuring a full well capacity of the test structure.

2. The method of claim 1 further comprising forming a color filter and a micro-lens on a backside of the semiconductor substrate.

3. The method of claim 2, wherein the measuring the full well capacity of the photo diode is performed before the forming the color filter and the micro-lens.

4. The method of claim 2, wherein the measuring the full well capacity of the photo diode is performed after the forming the color filter and the micro-lens.

5. The method of claim 1, wherein the measuring the full well capacity of the photo diode comprises:
    applying a negative voltage on the gate of the transfer-gate transistor;
    applying a positive voltage on the floating diffusion capacitor; and
    sweeping voltages on the photo diode, wherein the voltages change between negative voltages and positive voltages.

6. The method of claim 1, wherein the burning the electrical fuse is performed after a plurality of metal layers and metal pads are formed on a front side of the semiconductor substrate.

7. The method of claim 1 further comprising forming a diode, wherein the diode and the electrical fuse are serially connected between the gate of the transfer-gate transistor and an electrical ground.

8. The method of claim 7, wherein the diode is between the electrical fuse and the electrical ground.

9. The method of claim 1, wherein the test structure is formed in a scribe line of a wafer that comprises the semiconductor substrate.

10. A method comprising:
    performing a front-side process on a wafer, wherein the front-side process comprises:
        forming transistors and diodes, with portions of the transistors and diodes in a semiconductor substrate; and
        forming an interconnect structure comprising metal lines and vias electrically coupling to the transistors and diodes, wherein the interconnect structure is on a front side of the semiconductor substrate;
    after the front-side process, burning an electrical fuse to disconnect a test structure in the wafer from an electrical ground, wherein the test structure comprises an image sensor pixel unit; and
    after the burning the electrical fuse, measuring a full well capacity of the image sensor pixel unit.

11. The method of claim 10, wherein the image sensor pixel unit is formed during the front-side process.

12. The method of claim 10 further comprising, after the measuring the full well capacity, forming color filters and micro-lenses, wherein the color filters and the micro-lenses are on a backside of the semiconductor substrate.

13. The method of claim 10 further comprising forming the image sensor pixel unit comprising:
    forming a transfer-gate transistor, with a gate of the transfer-gate transistor connected to the electrical fuse;
    forming a photo diode connected to a first source/drain region of the transfer-gate transistor; and
    forming a floating diffusion capacitor, wherein the floating diffusion capacitor is connected to a second source/drain region of the transfer-gate transistor.

14. The method of claim 10 further comprising forming a diode, wherein the electrical fuse and the diode are serially coupled between the image sensor pixel unit and the electrical ground.

15. A method comprising:
    forming a test structure comprising:
        forming a first transfer-gate transistor at a front side of a semiconductor substrate;
        forming a first photo diode connected to a first source/drain region of the first transfer-gate transistor;

forming a first floating diffusion capacitor, wherein the first floating diffusion capacitor is connected to a second source/drain region of the first transfer-gate transistor; and forming an electrical fuse and a diode serially coupled between a gate of the first transfer-gate transistor and a electrical ground;

forming an image sensor array comprising forming a pixel unit, wherein the forming the pixel unit comprises:

forming a second transfer-gate transistor at the front side of the semiconductor substrate, wherein no electrical fuse is connected to a gate of the second transfer-gate transistor;

forming a second photo diode connected to a third source/drain region of the second transfer-gate transistor; and forming a second floating diffusion capacitor, wherein the second floating diffusion capacitor is connected to a fourth source/drain region of the second transfer-gate transistor;

burning the electrical fuse; and after the electrical fuse is burned, measuring a full well capacity of the test structure.

16. The method of claim 15, wherein the first and the second transfer-gate transistors are formed simultaneously, the first and the second photo diodes are formed simultaneously, and the first and the second floating diffusion capacitors are formed simultaneously.

17. The method of claim 15 further comprising forming a color filter and a micro-lens on a backside of the semiconductor substrate.

18. The method of claim 17, wherein the measuring the full well capacity is performed before the forming the color filter and the micro-lens.

19. The method of claim 17, wherein the measuring the full well capacity of the test structure is performed after the forming the color filter and the micro-lens.

20. The method of claim 15, wherein the burning the electrical fuse is performed after a plurality of metal layers and metal pads are formed on a front side of the semiconductor substrate.

* * * * *